(12) United States Patent
Kurita et al.

(10) Patent No.: US 6,658,722 B1
(45) Date of Patent: Dec. 9, 2003

(54) PROCESS FOR PRODUCING MAGNETIC HEAD SUSPENSION

(75) Inventors: Hideyuki Kurita, Kanuma (JP); Masanao Watanabe, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/461,193

(22) Filed: Dec. 15, 1999

(30) Foreign Application Priority Data

Dec. 28, 1998 (JP) .......................... 10-373101

(51) Int. Cl.[7] .............................. G11B 5/48; G11B 5/127
(52) U.S. Cl. ................... 29/603.03; 29/603.04; 29/603.07; 216/22; 216/41; 360/244.3; 360/245.9
(58) Field of Search ................. 29/603.03, 603.04, 29/603.01, 603.07, 829, 830, 846, 847; 360/244.3, 245.9; 216/22, 41, 75, 83, 100, 105; 428/209, 901

(56) References Cited

U.S. PATENT DOCUMENTS

| 5,145,553 A | | 9/1992 | Albrechta et al. | |
| 5,597,496 A | * | 1/1997 | Masaichi et al. | ............. 216/75 |
| 5,630,948 A | | 5/1997 | Ueda et al. | |
| 5,666,717 A | | 9/1997 | Matsumoto et al. | |
| 5,771,569 A | * | 6/1998 | Inaba | ....................... 29/603.04 |
| 5,809,634 A | * | 9/1998 | Inaba | ....................... 29/603.04 |
| 6,303,230 B1 | | 10/2001 | Watanabe et al. | |

FOREIGN PATENT DOCUMENTS

| JP | A-60-157286 | | 8/1985 | |
| JP | A-60-243120 | | 12/1985 | |
| JP | 63-005530 | * | 1/1988 | .................. 216/41 |
| JP | A-63-239998 | | 10/1988 | |
| JP | A-1-245586 | | 9/1989 | |
| JP | 3-83397 | * | 4/1991 | .................. 29/829 |
| JP | A-3-123093 | | 5/1991 | |
| JP | A-5-139027 | | 6/1993 | |
| JP | 09-306114 | | 11/1997 | |
| JP | 2000-195032 | | 7/2000 | |
| WO | WO96/22597 | | 7/1996 | |

* cited by examiner

Primary Examiner—A. Dexter Tugbang
(74) Attorney, Agent, or Firm—Oliff & Berridge, PLC

(57) ABSTRACT

(a) A method of manufacturing a magnetic head suspension includes a polyimide precursor layer 2 that is formed over a springy material layer 1, (b) a metal layer 3 for lines is formed over the polyimide precursor layer 2, (c) the metal layer 3 is patterned by the subtractive process to produce lines 4, (d) the polyimide precursor layer 2 is patterned by a photolithographic technique to give the configuration corresponding to a polyimide insulating base layer 5, (e) the patterned polyimide precursor layer 2 is imidated to produce the polyimide insulating base layer 5, and (f) a cover coat layer 6 is formed over the lines 4.

5 Claims, 3 Drawing Sheets

PROCESS FOR PRODUCING MAGNETIC HEAD SUSPENSION

BACKGROUND OF THE INVENTION

1. Field of the Invention

The present invention relates to a suspension for supporting the magnetic head in a hard disk device, and more particularly to a production process for an integrated wiring type magnetic head suspension.

2. Related Art of the Invention

In conventional magnetic head suspensions used in hard disk devices, the magnetic head element is situated on one end of a springy piece of metal, with the magnetic head element and the input/output terminal of the signal processing element of the hard disk device being connected via a wire that is not integrated with the springy piece of metal.

The development of smaller, higher capacity hard disk devices in recent years has created a need for magnetic head suspensions that are per se more compact and lightweight. However, wire size and weight has not been reduced adequately relative to the springy piece of metal. If magnetic head suspensions have become more compact and lightweight, wire mass and rigidity have increased relative to the piece of springy metal, creating the problem of an inability to produce a suspension having the desired performance.

Accordingly, there has been proposed a integrated wiring type compact lightweight type magnetic head suspension in which the desired performance is achieved by integrating lightweight wiring with the piece of springy metal (Japanese Patent Application Laid-open No. HEI9-306114). The wiring for this integrated wiring type magnetic head suspension is produced in the manner illustrated in FIGS. 3A to 3G.

First, a laminate material of stainless steel foil (springy piece) 31/polyimide film (insulating base) 32/copper foil (wiring) 33 laminated using an adhesive (not shown) is prepared (FIG. 3A).

The copper foil 33 in the laminate material is patterned by a photolithographic process to form a metal mask 34 (FIG. 3B). This metal mask 34 functions as an etching mask for etching the polyimide film 32 to give an insulating base 35 of the desired configuration (see FIG. 3C). Examples of the etching method used here include irradiation with excimer laser light, plasma etching, strong alkali wet etching, etc.

Next, the laminate material is irradiated from the metal mask 34 side with, e.g., excimer laser light L, and the polyimide film 32 in the exposed areas is removed by photoetching (leaving sufficient thickness to prevent the stainless steel foil 31 from being exposed) to form the insulating base 35 (FIG. 3C).

Next, the metal mask 34 is patterned by a photolithographic technique to form a line 36 (FIG. 3D).

Next, the thin polyimide film over the stainless steel foil 31, except for the insulating base 35, is removed through photoetching by irradiation with the excimer laser light L (FIG. 3E).

Next, a cover coat layer 37 is formed over the lines 36 using ordinary methods (FIG. 3F). This process gives an integrated wiring type magnetic head suspension. Optionally, the stainless steel foil 31 is typically subjected to a bending process to improve the mechanical properties of the suspension (FIG. 3G).

However, the production process for the integrated wiring type magnetic head suspension depicted in FIGS. 3A to 3G requires that the copper foil are patterned twice (for the metal mask patterning and the line patterning), and there is a search for unification of the copper foil patterning process. Regarding methods for patterning the polyimide film which serves as the insulating base, irradiation with excimer laser light involves high equipment costs, frequent maintenance, high running costs, deposition of conductive carbonized material on the laser irradiated area, and other problems. Wet etching methods require the use of expensive etchants which are also harmful to humans, and thus pose a number of problems in terms of operating safety and disposal.

SUMMARY OF THE INVENTION

The present invention is intended to solve the drawbacks of the technology described above, and its object is to provide a production process for an integrated wiring type magnetic head suspension whereby the copper foil for the lines can be patterned in a single process, and the insulating base can be produced simply and inexpensively.

The inventors perfected the present invention on the basis of the discovery that a polyimide precursor layer (e.g., a polyamic acid layer, etc.), being thermoplastic, exhibits excellent adhesion, and can be readily removed through a process of salt formation with inexpensive alkalis followed by treatment warm water; that the precursor layer can be converted into a polyimide exhibiting excellent adhesion, heat resistance, and dimensional stability by means of an imidation process that does not require equipment costs and may be carried out by a simple procedure; and that the polyimide precursor layer can withstand the conditions for copper foil patterning (acid etchants, etc.), obviating the need for the copper foil to function as a metal mask so that copper foil patterning can be accomplished in a single step.

Specifically, the present invention provides a process for producing a magnetic head suspension, comprising steps of:
(a) forming a polyimide precursor layer over a springy material layer;
(b) forming a metal layer for lines over the polyimide precursor layer;
(c) patterning the metal layer by the subtractive process to produce the lines;
(d) patterning the polyimide precursor layer by a photolithographic technique so as to give a configuration corresponding to the polyimide insulating base layer;
(e) imidating the patterned polyimide precursor layer to produce the polyimide insulating base layer; and
(f) forming a cover coat layer over the lines.

In this process, step (f) may be performed after step (e); alternatively, step (f) may comprise:
an initial step coming between step (c) and step (d), wherein a cover coat polyimide precursor layer is provided over the lines;
an intermediate step wherein this cover coat polyimide precursor layer is patterned to the desired cover coat layer configuration simultaneously with patterning of the polyimide precursor layer to the configuration corresponding to the polyimide insulating base layer in step (d); and
a final step wherein the cover coat polyimide precursor layer is imidated to form the cover coat layer simultaneously with formation of the polyimide insulating base layer in step (e).

In another aspect, the present invention provides a process for producing a magnetic head suspension, comprising steps of:

(aa) forming a polyimide precursor layer over a springy material layer;

(bb) forming lines on the polyimide precursor layer by the semiadditive process;

(cc) patterning the polyimide precursor layer by a photolithographic technique so as to give a configuration corresponding to the polyimide insulating base layer;

(dd) imidating the patterned polyimide precursor layer to produce the polyimide insulating base layer; and (ee) forming a cover coat layer over the lines.

In this process, step (ee) may be performed after step (dd); alternatively step (ee) may comprise:

an initial step coming between step (bb) and step (cc), wherein a cover coat polyimide precursor layer is provided over the lines;

an intermediate step wherein this cover coat polyimide precursor layer is patterned to the desired cover coat layer configuration simultaneously with patterning of the polyimide precursor layer to the configuration corresponding to the polyimide insulating base layer in step (cc); and a final step wherein the cover coat polyimide precursor layer is imidated to form the cover coat layer simultaneously with formation of the polyimide insulating base layer in step (dd).

These and other objects, features and advantages of the present invention are described in or will become apparent from the following detailed description of the invention.

DETAILED DESCRIPTION OF THE INVENTION

The steps in the magnetic head suspension production process which pertains to the present invention are described in detail below with reference to the accompanying drawings.

FIGS. 1A to 1G indicate an example of line formation by the subtractive process; FIGS. 2A to 2F indicate an example of line formation by the semiadditive process. The embodiment of FIGS. 1A to 1G is described first.

Step (a)

Figure 1A:
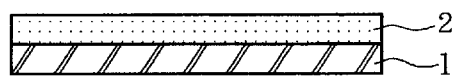
FIGS. 1A to 1G indicate a process diagram of production of an integrated wiring type magnetic head suspension in accordance with the present invention.

A polyimide precursor layer 2 is formed over a springy material layer 1 (FIG. 1A).

Specifically, a polyimide precursor varnish prepared by dissolving a polyimide precursor (e.g., a polyamic acid, etc.) in N-methyl pyrrolidone, etc., is applied to one side of the springy material layer 1 (e.g., springy stainless steel foil, etc.) by means of a comma coater, knife coater, roll coater, lip coater, die coater, or the like, and is then dried by heating (typically at 150° C. to 200° C.) so that the residual volatile fraction (solvent, water generated upon condensation, etc.) content (percentage by weight (wt %) of total volatile components present in the polyimide precursor layer) is held to 30 to 50 wt % in order to prevent any decline in interlayer adhesive strength or bubbles in subsequent steps, yielding the polyimide precursor layer 2.

The polyimide precursor undergoes partial imidation during this drying process; care is taken so that imidation ratio of the polyimide precursor layer 2 does not exceed 50% at the end of the drying process. Fine precise patterning of the polyimide precursor layer 2 at low cost by photolithographic techniques employing alkali etching solution is possible provided that imidation ratio does not exceed 50%.

In preferred practice, the polyimide precursor layer 2 will have a thickness of 5 to 25 $\mu$m, since if too thin it will lack mechanical strength, while if too thick the imidated polyimide insulating layer will have undesired effects on plastic deformation of the springy material layer 1.

In preferred practice, to prevent undesired deformation of the springy material layer 1, the polyimide precursor constituting the polyimide precursor layer 2 will be one such that the coefficient of linear thermal expansion of the polyimide produced by imidation of the polyimide precursor is about equal to the coefficient of linear thermal expansion of the springy material layer 1 when annealed under imidation conditions.

Examples of polyimide precursors which may be used include polyamic acids prepared from acid dianhydrides and diamines (see Japanese Patent Application Laid-open No. SHO60-157286, Japanese Patent Application Laid-open No. SHO60-243120, Japanese Patent Application Laid-open SHO63-239998, Japanese Patent Application laid-open No. HEI1-245586, Japanese Patent Application laid-open No. HEI3-123093, and Japanese Patent Application Laid-open No. HEI5-139027); partially imidated polyamic acids obtained from diisocyanate compounds and dianhydride-terminated polyamic acid prepolymer synthesized from a diamine and an excess of dianhydride (see Polyamide Resin Handbook, Nikkan Kogyo Shinbun Sha (p. 536, 1988); Kobunshi Toronshu, 47(6), 1990); and the like. Of these, polyamic acids obtained from acid dianhydrides and diamines are especially preferred.

Examples of preferred acid dianhydrides are pyromellitic dianhydride (PMDA), 3,4,3',4'-biphenyltetracarboxylic dianhydride (BPDA), 3,4,3',4'-benzophenonetetracarboxylic dianhydride (BTDA), 3,4,3',4'-dibiphenylsulfonetetracarboxylic dianhydride (DSDA), and the like. Examples of preferred diamines are 4,4'-diaminodiphenyl ether (DPE), p-phenylenediamine (p-PDA), 4,4'-diaminobenzanilide (DABA), 4,4'-bis(paminophenoxy)diphenylsulfone (BAPS), and the like.

As the springy material layer 1, there may be used those used in magnetic head suspensions of the conventional art. Examples thereof include SUS 304 foil, SUS 430 foil, and other stainless steels.

Typically, the springy material layer 1 has a thickness of 20 to 25 $\mu$m.

Step (b)

Figure 1F:
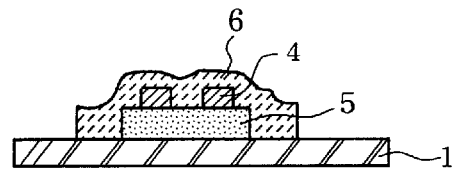
Figure 1B:
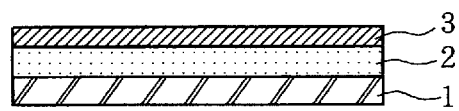
Figure 1B:
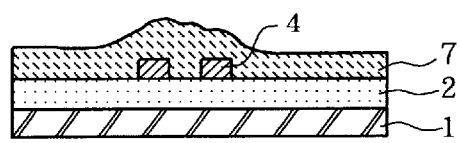

Next, a metal layer 3 for lines is formed over the polyimide precursor layer 2 (FIG. 1B).

Specifically, metal foil (e.g., electrolytic copper foil, etc.) for the metal layer 3 for lines is laminated over the polyimide precursor layer 2 using a hot press method, roll lamination method, etc. Alternatively, a thin film of metal (copper, etc.) may be deposited over the polyimide precursor layer 2 by sputtering, and an additional copper plating layer of electrolytic copper or the like is deposited thereon as a second metal layer.

Step (c)

Figure 1C:
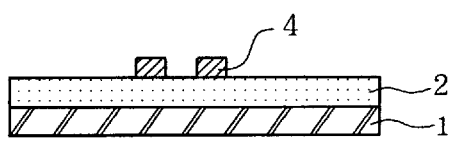
Figure 1C:
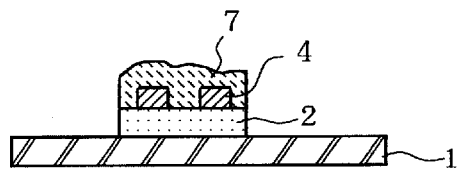
Figure 1D:
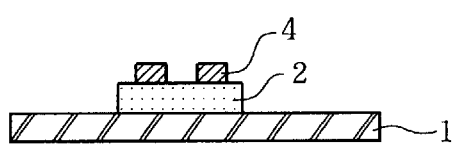
Figure 1D:
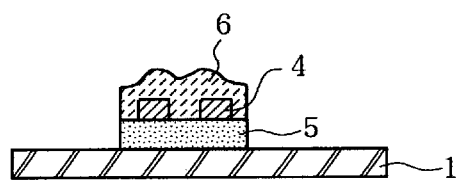

Next, lines 4 are produced by patterning of the metal layer 3 by means of the subtractive process employing a photolithographic technique capable of fine patterning and precise alignment (FIG. 1C).

Specifically, a protective film (in preferred practice, easy-release low-adhesion tape) is used to cover the surface of the springy material layer 1, a line pattern resist layer is formed over the metal layer 3, and the metal layer 3 is etched with an etching solution (e.g., copper(II) chloride aqueous solution, etc.) to form the lines 4, and the line pattern resist layer and protective film are peeled away.

Step (d)

The polyimide precursor layer 2 is patterned (FIG. 1D) by a photolithographic technique so as to give the configuration corresponding to the polyimide insulating base layer 5, described later (see FIG. 1E). Specifically, a patterning resist layer is formed over the polyimide precursor layer 2, treated with alkali aqueous solution (e.g., tetramethylammonium hydroxide aqueous solution, sodium hydroxide aqueous solution, etc.), and rinsed with warm water to effect patterning.

Step (e)

Figure 1E:
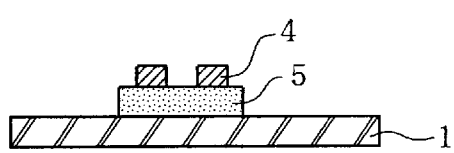

Next, the polyimide precursor layer 2 is subjected to imidation to produce the polyimide insulating base layer 5 (FIG. 1E).

Conditions for imidation may be selected empirically with reference to the type of polyimide precursor and other factors. For example, a stepped heating process conducted at atmospheric pressure in a nitrogen gas environment at 160° C. (30 minutes)/180° C. (30 minutes)/250° C. (30 minutes)/300° C. (30 minutes) may be used.

Step (f)

Next, a cover coat layer 6 is formed over the lines 4 (FIG. 1F), thereby giving the magnetic head suspension.

Step (f) may be carried out after step (e); alternatively, step (f) may comprise: an initial step coming between step (c) and step (d), wherein a cover coat polyimide precursor layer 7 is provided over the lines 4; an intermediate step wherein this cover coat polyimide precursor layer 7 is patterned to the desired cover coat layer configuration simultaneously with patterning of the polyimide precursor layer 2 to the configuration corresponding to the polyimide insulating base layer 5 in step (d); and a final step wherein the cover coat polyimide precursor layer 7 is imidated to form the cover coat layer 6 simultaneously with formation of the polyimide insulating base layer 5 in step (e).

When carrying out step (f) after step (e), one specific method is to apply a photosensitive resin over the lines 4 and subject this to photosetting after the patterning step to form a cover coat layer 6. Alternatively, a cover coat polyimide precursor layer 7 may be formed over the lines 4 as in step (a), patterned, and then subjected to imidation as in step (d) to produce the cover coat layer 6.

Where step (e) comprises the initial step, intermediate step and final step as described earlier, one specific method is to provide a cover coat polyimide precursor layer 7 over the lines 4 after completing step (c) (FIG. 1F1), to then conduct simultaneous patterning of the cover coat polyimide precursor layer 7 in step (d) (FIG. 1F2), and to then form the cover coat layer 6 through simultaneous imidation in step (e) (FIG. 1F3).

Step (g)

Figure 1G:
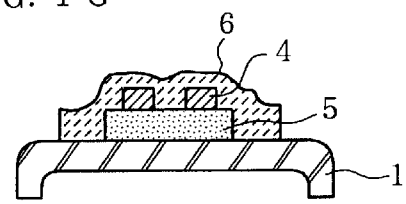

Optionally, the springy material layer 1 of the magnetic head suspension produced in the foregoing manner can be subjected to a bending process (FIG. 1G). Shape stability can be imparted to the springy material layer 1 thereby. Alternatively, the springy material layer 1 can be etched to a desired configuration by the subtractive process (not shown).

The embodiment of FIGS. 2A to 2F is now described.

Step (aa)

Figure 2A:
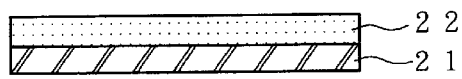
FIGS. 2A to 2F indicate a process diagram of production of an integrated wiring type magnetic head suspension in accordance with the present invention.

As in step (a) in the embodiment depicted in FIGS. 1A to 1G, a polyimide precursor layer 22 is formed over a springy material layer 21 (FIG. 2A).

Step (bb)

Figure 2B:
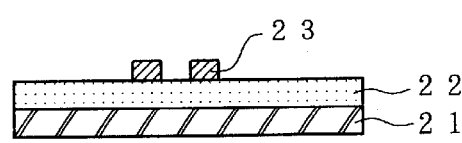

Lines 23 are formed on the polyimide precursor layer 22 by the semiadditive process (FIG. 2B). Specifically, a protective film is applied over the springy material layer 21, a thin film of copper or the like is deposited over the polyimide precursor layer 22 by sputtering, a conductor circuit pattern resist layer is produced over the thin film, a metal plating layer of copper or the like is deposited thereon by electrolytic plating, the line pattern resist layer is removed using ordinary methods, the lines 23 are formed by soft etching, and the protective film is then removed.

Step (cc)

Figure 2C:
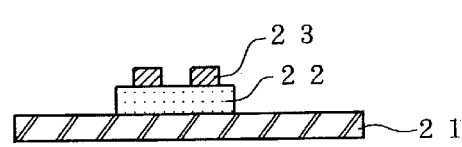

Using a photolithographic technique, the polyimide precursor layer 22 is patterned to the configuration corresponding to a polyimide insulating base layer 24 (see FIG. 2D) in a manner analogous to step (d) in the embodiment of FIGS. 1A to 1G (FIG. 2C).

Step (dd)

Figure 2D:
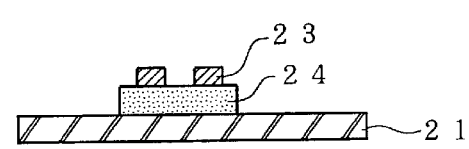

The patterned polyimide precursor layer 22 is subjected to imidation analogously to step (e) in the embodiment of FIGS. 1A to 1G to form the polyimide insulating base layer 24 (FIG. 2D).

Step (ee)

Next, a cover coat layer 25 is formed over the lines 23 (FIG. 2E), thereby giving the magnetic head suspension.

Step (ee) may be carried out after step (dd); alternatively, step (ee) may comprise the initial step coming between step (bb) and step (cc), wherein a cover coat polyimide precursor layer is provided over the lines; an intermediate step wherein this cover coat polyimide precursor layer is patterned to the desired cover coat layer configuration simultaneously with patterning of the polyimide precursor layer to the configuration corresponding to the polyimide insulating base layer in step (cc); and a final step wherein the cover coat polyimide precursor layer is imidated to form the cover coat layer simultaneously with formation of the polyimide insulating base layer in step (dd).

Figure 2E:
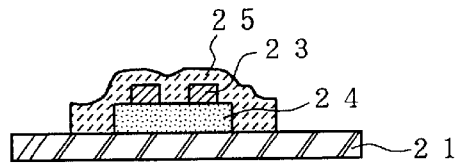
Figure 2E:
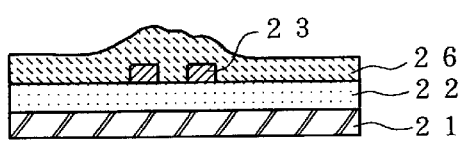
Figure 2E:
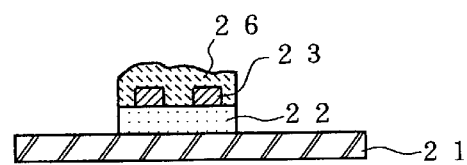
Figure 2E:
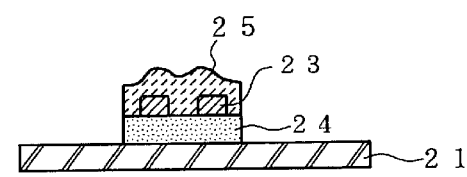

When carrying out step (ee) after step (dd), one specific method is to apply a photosensitive resin over the lines 23 and subject this to photosetting after the patterning step to form the cover coat layer 25. Alternatively, a cover coat polyamic acid layer may be formed over the lines 23 as in step (aa), patterned, and then subjected to imidation as in step (d) to produce the cover coat layer 25.

Where step (ee) comprises the initial step, intermediate step and final step as described earlier, one specific method is to provide a cover coat polyimide precursor layer 26 over the lines 23 after completing step (bb) (FIG. 2E1), to then conduct simultaneous patterning of the cover coat polyimide precursor layer 26 in step (cc) (FIG. 2E2), and to then form the cover coat layer 25 through simultaneous imidation in step (dd) (FIG. 2E3).

Step (ff)

Figure 2F:
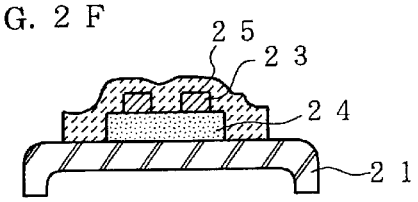
Figure 3A:
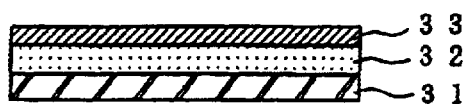
FIGS. 3A to 3G indicate a process diagram of conventional production of an integrated wiring type magnetic head suspension.
Figure 3B:
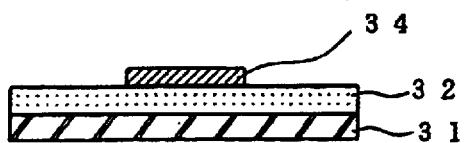
Figure 3C:
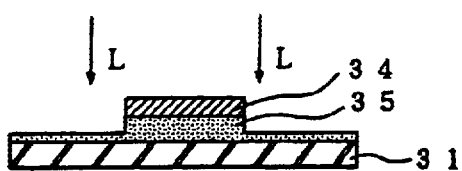
Figure 3D:
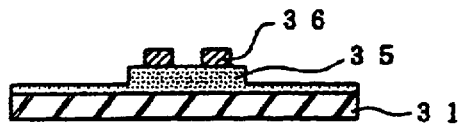
Figure 3E:
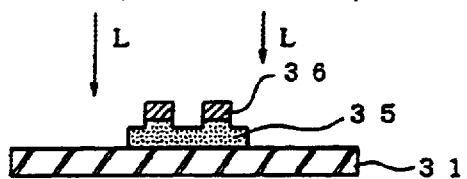
Figure 3F:
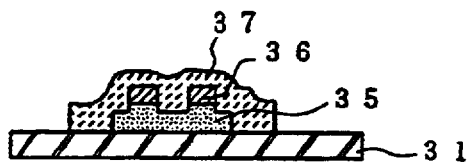
Figure 3G:
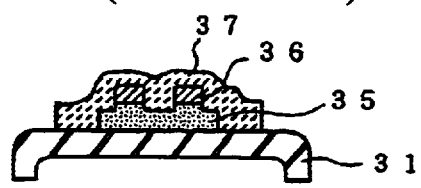

Optionally, the springy material layer 21 of the magnetic head suspension produced in the foregoing manner can be subjected to a bending process (FIG. 2F). Shape stability can be imparted to the springy material layer 21 thereby. Alternatively, the springy material layer 21 can be etched to a desired configuration by the subtractive process (not shown).

According to the embodiment depicted in FIGS. 1A to 1G, the polyimide precursor layer 2 is first provided over the springy material layer 1, and the metal layer 3 for lines there is then provided over the polyimide precursor layer 2; alternatively, it is possible to provide the polyimide precursor layer 2 over the metal layer 3 and to then provide the springy material layer 1 over the polyimide precursor layer 2. That is, a production process wherein the following steps (a') and (b') are performed in place of step (a) and step (b), with step (c) to step (f) being carried out in the manner described previously, also lies within the scope of the present invention.

Specifically, a process for producing a magnetic head suspension, comprising the following steps of:

(a') forming a polyimide precursor layer over a metal layer for lines;

(b') forming a springy material layer over the polyimide precursor layer;

(c) patterning the metal layer by the subtractive process to produce the lines;

(d) patterning the polyimide precursor layer by a photolithographic technique so as to give the configuration corresponding to the polyimide insulating base layer;

(e) imidating the patterned polyimide precursor layer to produce the polyimide insulating base layer; and (f) forming a cover coat layer over the lines. lies within the scope of the present invention.

In this production process as well, step (f) may be carried out after step (e), or alternatively, step (f) may consist of an initial step coming between step (c) and step (d), wherein a cover coat polyimide precursor layer is provided over the lines; an intermediate step wherein this cover coat polyimide precursor layer is patterned to the desired cover coat layer configuration simultaneously with patterning of the polyimide precursor layer to the configuration corresponding to the polyimide insulating base layer in step (d); and a final step wherein the cover coat polyimide precursor layer is imidated to form the cover coat layer simultaneously with formation of the polyimide insulating base layer in step (e).

Magnetic head suspensions produced in the foregoing manner are extremely compact and lightweight since the lines are integrally produced on the piece of springy metal, and are thus favorable for use in hard disk devices with larger recording capacities. The wireless design greatly improves productivity in assembly of the magnetic head element with the piece of springy metal, and can accommodate higher data transfer speeds.

EXAMPLES

The invention is described in greater detail below.

REFERENCE EXAMPLE

In a 60-liter reaction kettle equipped with a temperature controller and jacket, 1.05 kg (11.2 mol) of p-phenylenediamine (PDA, ex Mitsui Kagaku) and 0.86 kg (4.8 mol) of 4,4'-diaminodiphenyl ether (DPE, ex Wakayama Seika) were dissolved in about 45 kg of N-methyl-2-pyrrolidone solvent (NMP ex Mitsubishi Kagaku) under nitrogen gas atmosphere. At 50° C., 3.523 kg (16.14 mol) of pyromellitic dianhydride (PMDA ex Mitsubishi Gasu Kagaku) was added gradually while reacting for 3 hours. This procedure yielded a polyamic acid varnish with a solids content of about 12% and viscosity of 25 Pa·S (25° C.).

Working Example 1

The polyamic acid varnish prepared in the Reference Example was applied to 25 μm-thick stainless steel foil (SUS foil). The solvent was removed out in a continuous furnace at 100° C. (5 min), 140° C. (5 min) and 170° C. (10 min), producing a 10 μm-thick polyamic acid layer as a polyimide precursor layer.

9 μm-thick copper foil was superposed over the polyamic acid layer and hot-pressed for 10 minutes in a 170° C. pressing machine (50 kg/cm$^2$).

The surface of the SUS foil was then covered with a protective film. A line pattern resist layer was then formed over the copper foil, and the copper foil was etched with an etching solution (copper(II) chloride aqueous solution, etc.) to produce lines at 70 μm pitch. The line pattern resist layer and protective film were then removed.

A polyamic acid layer etching resist pattern layer was formed over the lines and processed in an aqueous solution of TMAH (tetramethylammonium hydroxide) heated to 60° C., followed by rinsing in 60° C. warm water to effect patterning of the polyamic acid layer. The etching resist pattern layer was then removed using ordinary methods.

The resulting laminate comprising a SUS foil/patterned polyamic acid layer/line was charged to a heat treatment apparatus and subjected to imidation through stepped heating at 160° C. (30 minutes)/180° C. (30 minutes)/250° C. (30 minutes)/300° C. (30 minutes), converting the polyamic acid layer to a polyimide insulating base layer.

A cover coat polyamic acid layer was then formed over the lines and subjected to imidation to produce the cover coat layer. This procedure gave a magnetic head suspension.

Working Example 2

The polyamic acid varnish prepared in the Reference Example was applied to 25 μm-thick stainless steel foil (SUS foil). The solvent was evaporated out in a continuous furnace at 100° C. (5 min), 140° C. (5 min) and 170° C. (10 min), producing a 10 μm-thick polyamic acid layer as a polyimide precursor layer.

An Ni layer approximately 200 Å thick was deposited over the polyimide precursor layer by sputtering, a Cu layer approximately 1000 Å thick was deposited thereon, and a line pattern resist layer was formed over this thin film. An electrolytic copper plating layer 18 μm thick was deposited by electrolytic plating, and the line pattern resist layer was removed. The entire face was then subjected to soft etching with a mixture of hydrogen peroxide and sulfuric acid to form lines.

A polyamic acid layer etching resist pattern layer was formed over the lines and processed in an aqueous solution of TMAH (tetramethylammonium hydroxide) heated to 60° C., followed by rinsing in 60° C. warm water to effect patterning of the polyamic acid layer. The etching resist layer was then removed using ordinary methods.

The resulting laminate comprising a SUS foil/patterned polyamic acid layer/line was charged to a heat treatment apparatus and subjected to imidation through stepped heating at 160° C. (30 minutes)/180° C. (30 minutes)/250° C. (30 minutes)/300° C. (30 minutes), converting the polyamic acid layer to a polyimide insulating base layer.

A cover coat polyamic acid layer was then formed over the lines and subjected to imidation to produce the cover coat layer. This procedure gave a magnetic head suspension.

According to the production process of the present invention, there is provided an integrated wiring type magnetic head suspension whereby the copper foil for the lines can be patterned in a single process, and the insulating base can be produced simply and inexpensively.

The entire disclosure of the specification, claims, summary and drawings of Japanese Patent application No. 10-373101 filed on Dec. 28, 1998 is herein incorporated by reference in its entirety.

What is claimed is:

1. A process for producing a magnetic head suspension, comprising steps of:
   (a) forming a polyimide precursor layer over a springy material layer;
   (b) forming a metal layer for lines over the polyimide precursor layer;
   (c) patterning the metal layer by forming a line pattern resist layer over the metal layer, etching the metal layer with an etching solution and peeling away the line pattern resist layer, to form patterned lines;
   (d) patterning the polyimide precursor layer by a photolithographic technique so as to give a desired configuration;
   (e) imidating the patterned polyimide precursor layer to produce a polyimide insulating base layer; and
   (f) forming a cover coat layer over the lines, wherein the metal layer is only patterned during step (c).

2. The process according to claim 1, wherein step (f) is performed after step (e).

3. A process for producing a magnetic head suspension, comprising the steps of:
   (a) forming a polyimide precursor layer over a springy material layer;
   (b) forming a metal layer for lines over the polyimide precursor layer;
   (c) patterning the metal layer by forming a line pattern resist layer over the metal layer, etching the metal layer with an etching solution and peeling away the line pattern resist layer, to form patterned lines;
   (d) patterning the polyimide precursor layer by a photolithographic technique so as to give a desired configuration;
   (e) imidating the patterned polyimide precursor layer to produce a polyimide insulating base layer; and
   (f) forming a cover coat layer over the lines, wherein step (f) comprises:
      an initial step coming between step (c) and step (d), wherein a cover coat polyimide precursor layer is provided over the lines;
      an intermediate step wherein the cover coat polyimide precursor layer is patterned to the desired cover coat layer configuration simultaneously with patterning of the polyimide precursor layer to the desired configuration in step (d); and
      a final step wherein the cover coat polyimide precursor layer is imidated to form the cover coat layer simultaneously with formation of the polyimide insulating base layer in step (e).

4. A process for producing a magnetic head suspension, comprising:
   forming a laminate including a springy material layer, and a polyimide precursor layer for a polyimide insulating base layer;
   forming patterned lines on the polyimide precursor layer by at least one of a single semi-additive process and a single subtractive process;
   providing a cover coat polyimide precursor layer over the patterned lines;
   patterning the cover coat precursor layer to a desired cover coat configuration simultaneously with patterning of the polyimide precursor layer of the laminate to the desired configuration; and
   imidating the patterned cover coat precursor layer to form a cover coat layer simultaneously with formation of the polyimide insulating base layer.

5. The process of claim 4, wherein the metal layer is patterned by a single subtractive process.

* * * * *